(12) United States Patent
Ahrens

(10) Patent No.: US 7,457,126 B2
(45) Date of Patent: Nov. 25, 2008

(54) OPTICAL TRANSPONDER WITH ACTIVE HEAT TRANSFER

(75) Inventor: Michael E. Ahrens, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 11/168,184

(22) Filed: Jun. 27, 2005

(65) Prior Publication Data

US 2006/0291171 A1  Dec. 28, 2006

(51) Int. Cl.
H05K 7/20 (2006.01)
(52) U.S. Cl. .................... 361/716; 361/800; 361/704
(58) Field of Classification Search ......... 361/687–688, 361/700–701
See application file for complete search history.

(56) References Cited

U.S. PATENT DOCUMENTS

| | | | | |
|---|---|---|---|---|
| 5,854,869 | A * | 12/1998 | Joyce | 385/92 |
| 6,252,726 | B1 | 6/2001 | Verdiell | |
| 6,883,594 | B2 * | 4/2005 | Sarraf et al. | 165/104.33 |
| 6,893,293 | B2 * | 5/2005 | Ice et al. | 439/607 |
| 6,909,608 | B2 * | 6/2005 | Fan | 361/700 |
| 7,013,958 | B2 * | 3/2006 | Garner et al. | 165/104.26 |
| 7,028,758 | B2 * | 4/2006 | Sheng et al. | 165/104.21 |
| 7,090,412 | B2 * | 8/2006 | Kato et al. | 385/93 |
| 2003/0014980 | A1 * | 1/2003 | Ono | 62/3.2 |
| 2003/0141090 | A1 | 7/2003 | Kruger et al. | |
| 2003/0161108 | A1 | 8/2003 | Bright et al. | |
| 2004/0182552 | A1 * | 9/2004 | Kubo | 165/104.33 |
| 2004/0252953 | A1 * | 12/2004 | Crane et al. | 385/92 |
| 2005/0282436 | A1 * | 12/2005 | Hanley | 439/607 |
| 2006/0216958 | A1 * | 9/2006 | Yee et al. | 439/66 |
| 2006/0243427 | A1 * | 11/2006 | Kitajima et al. | 165/104.33 |

FOREIGN PATENT DOCUMENTS

| | | |
|---|---|---|
| EP | 1 206 018 A2 | 5/2002 |
| JP | 60153188 | 8/1985 |
| JP | 04179180 | 6/1992 |
| JP | 05167143 | 7/1993 |
| WO | WO 98/03997 | 1/1998 |

OTHER PUBLICATIONS

PCT/US2006/025203, PCT International Search Report and Written Opinion of the International Searching Authority, Mar. 1, 2007.

* cited by examiner

*Primary Examiner*—Hung S Bui
(74) *Attorney, Agent, or Firm*—Blakely, Sokoloff, Taylor & Zafman LLP

(57) ABSTRACT

According to embodiments of the present invention, an optical transponder module generates heat when operating and a heat pipe disposed in the module body performs active heat transfer from a hot end of the optical transponder module to a cooler end of the optical transponder module. A heat pipe disposed in an external clip-in heat sink may remove heat from the optical transponder body.

10 Claims, 6 Drawing Sheets

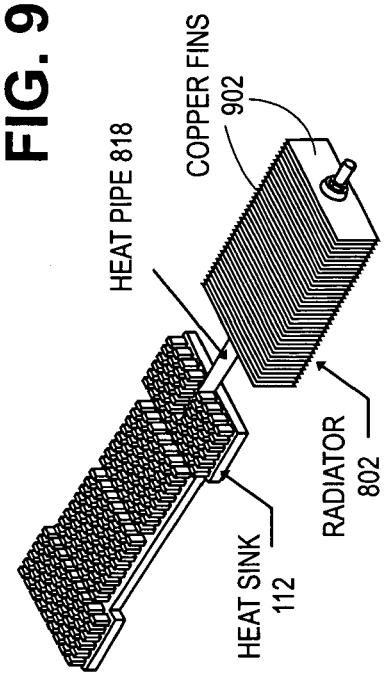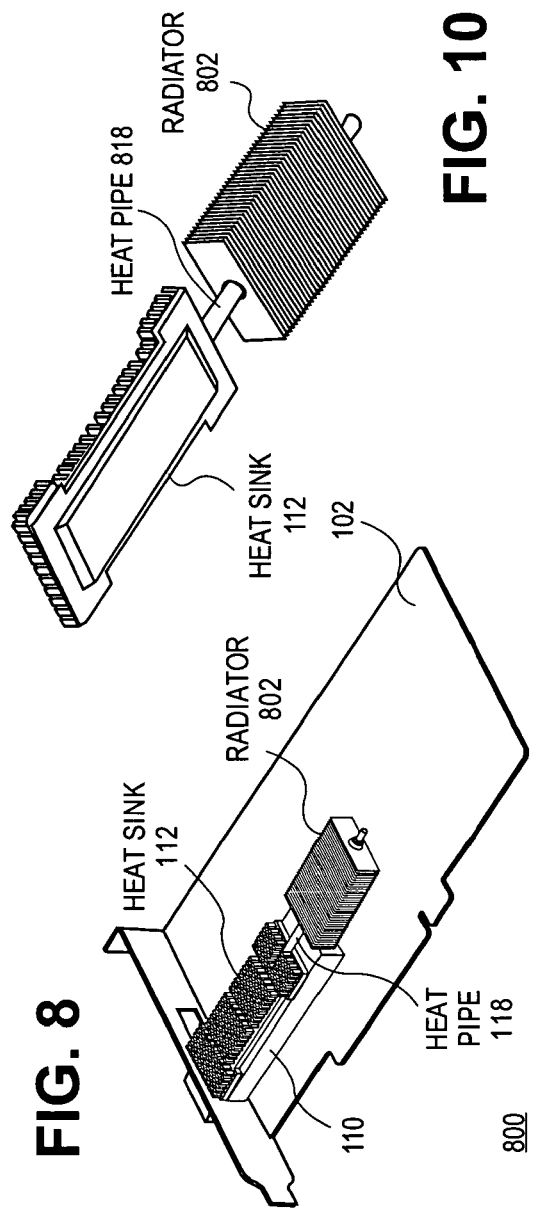

OPTICAL TRANSPONDER WITH ACTIVE HEAT TRANSFER

BACKGROUND

1. Field

Embodiments of the present invention relate to telecommunication equipment and, in particular, to optical transponders.

2. Discussion of Related Art

Transponders may be used in telecommunication systems and/or networks to receive and transmit data and/or other information on optical and/or electrical signals. Traditional optical transponders have limitations however.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 8 is a perspective view of an optical transponder assembly according to an alternative embodiment of the present invention;

FIG. 9 is a perspective view of the top of the radiator depicted in FIG. 8 according to an embodiment of the present invention; and FIG. 10 is a perspective view of the bottom of the radiator depicted in FIG. 8 according to an embodiment of the present invention.

DETAILED DESCRIPTION OF EMBODIMENTS

Figure 1:
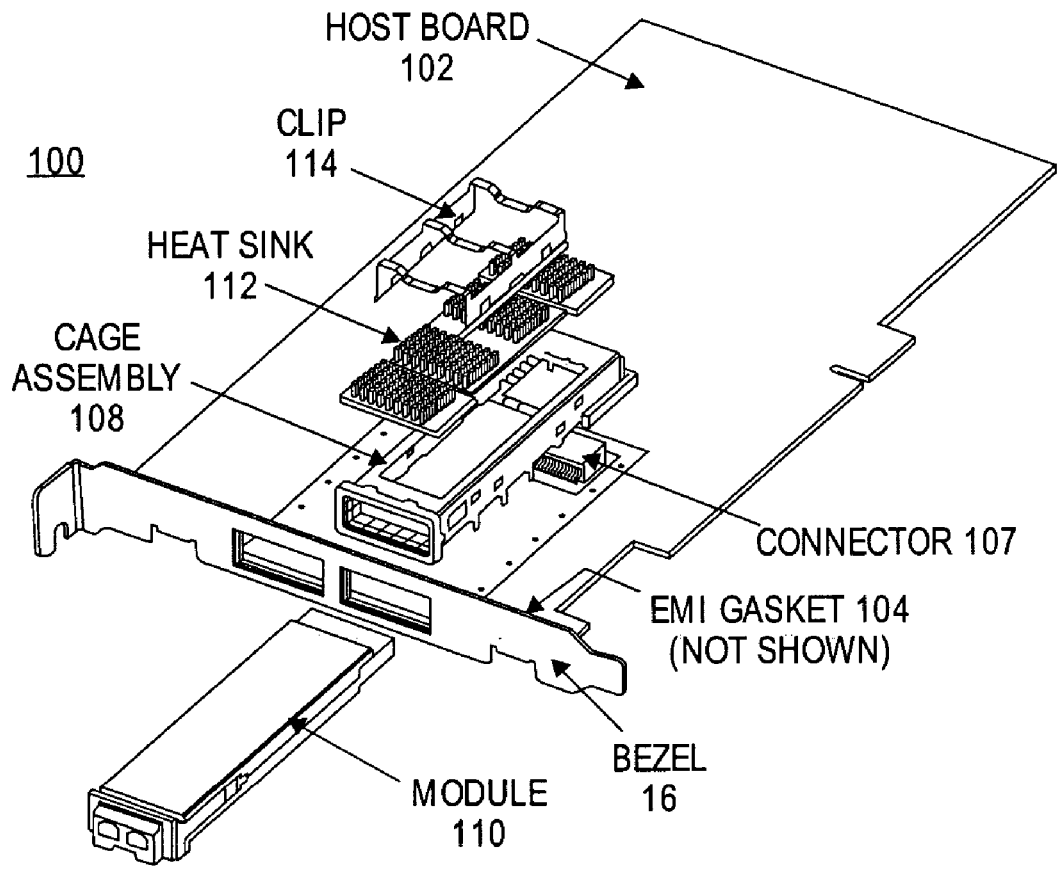
FIG. 1 is a perspective view of an optical transponder assembly according to an embodiment of the present invention.

FIG. 1 is a perspective view of mechanical component layout of an optical transponder assembly 100 according to an embodiment of the present invention. The illustrated example assembly 100 includes a host board 102 coupled to an electromagnetic interference (EMI) gasket 104. The EMI gasket is coupled to a bezel 106. When the optical transponder assembly 100 is assembled, a cage assembly 108 may be coupled to the host board 102 via a connector 107. When the optical transponder assembly 100 is assembled, a transponder module 110 may be disposed inside the cage assembly 108 and also coupled to the host board 102 via the connector 107. When the optical transponder assembly 100 is assembled, a heat sink 112 may be removably coupled to the cage assembly 108 and/or the optical transponder module 110 using a clip 114. In the illustrated embodiment, the optical transponder assembly 100 also includes a heat pipe 116 disposed in the module 110 and a heat pipe 118 disposed in the heat sink 112.

In embodiments of the present invention, the host board 102 may be any suitable printed circuit board that may host one or more optical transponder modules 110.

In embodiments of the present invention, the EMI gasket 104 may be any suitable gasket capable of shielding electromagnetic interference and/or radio frequency interference (RFI).

In embodiments of the present invention, the bezel 106 may be any suitable faceplate or cover for the host board 102.

In embodiments of the present invention, the connector 107 may be a 30-pin connector. For other embodiments, the connector 107 may be a 70-pin connector.

In embodiments of the present invention, the cage assembly 108 may be any suitable housing that reduces electromagnetic interference (EMI) emissions and/or reduces susceptibility of the transponder module circuitry to radiation. In one embodiment, the cage assembly 108 may be a Faraday cage.

The module 110 according to an embodiment of the present invention is described in more detail below with reference to FIG. 3.

In embodiments of the present invention, the heat sink 112 may be capable of passively transferring heat from one place to another, such as, for example, using air flow.

In embodiments of the present invention, the clip 114 may be any device capable of removably securing the heat sink 112 to the module 110 and/or the cage 108.

In embodiments of the present invention, the heat pipes 116 and 118 may be capable of actively transferring heat from one place to another, such as, for example, using dynamic movement of a heat transfer medium. The heat pipes may act as heat spreaders to move localized heat from the transponder module 110 and then spreading the heat out over a larger surface, namely the surface of the transponder module 110 and/or the heat sink 112. The heat pipes 116 and 118 are described in more detail below with reference to FIGS. 2-7.

Figure 2:
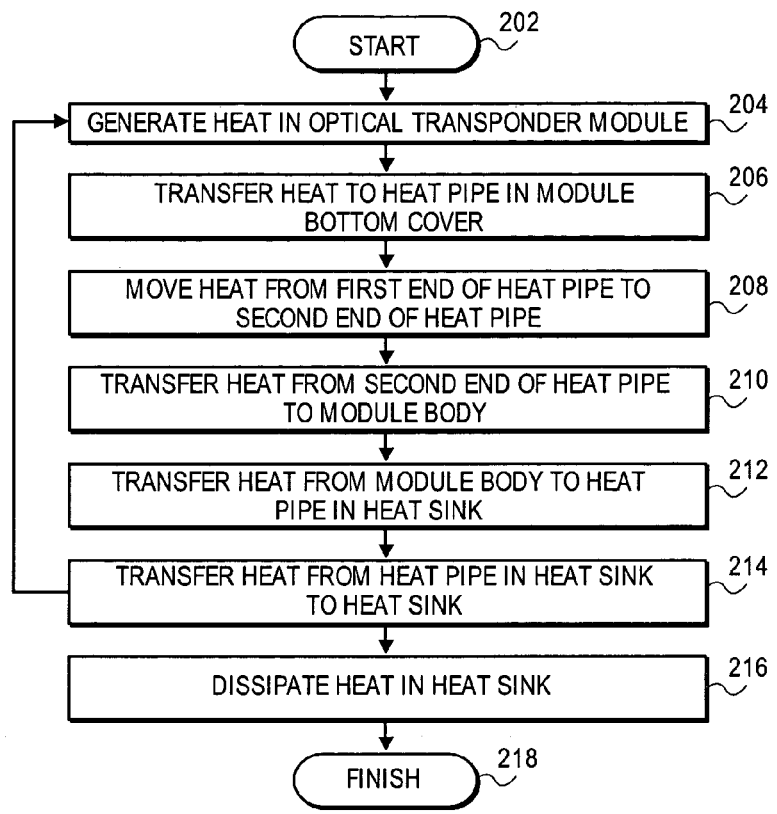
FIG. 2 is a flow chart illustrating a method for operating the optical transponder assembly 100 according to an embodiment of the present invention.

FIG. 2 is a flow chart illustrating a method 200 for operating the optical transponder assembly 100 according to an embodiment of the present invention, in which the heat pipes 116 and 118 may be used to provide active transfer of heat from one location in the optical transponder assembly 100 to another location in the optical transponder assembly 100. The method 200 will be described with reference to FIG. 3, which is an isometric diagram of the optical transponder assembly 100 in more detail according to an alternative embodiment of the present invention.

Figure 3:
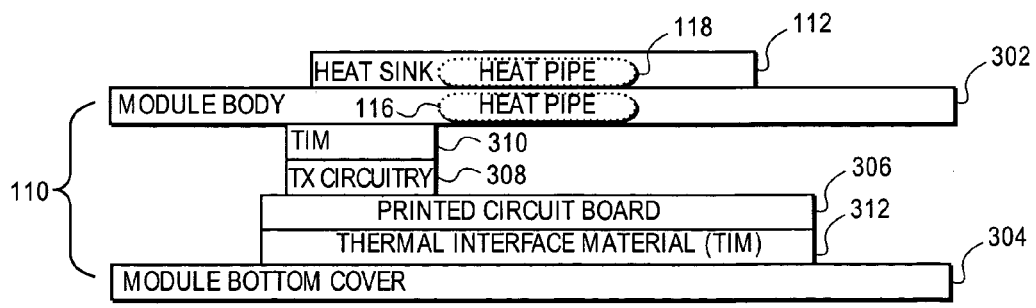
FIG. 3 is a perspective view of the optical transponder assembly in more detail according to an embodiment of the present invention.

FIG. 3 shows the module 110 having a module body 302 and a module bottom cover 304. A printed circuit board (PCB) 306 is disposed between the body 302 and the bottom cover 304. Transmitter circuitry 308 for the transmitter portion of the optical transponder assembly 100 is coupled to the printed circuit board 306. In the illustrated embodiment, thermal interface material (TIM) 310 is disposed between the transmitter circuitry 308 and the body 302, and interface material 312 is disposed between the printed circuit board 306 and the bottom cover 304. The heat pipe 116 is disposed in the body 302 and the heat pipe 118 is disposed in the heat sink 112.

In embodiments of the present invention, the transmitter circuitry 308 may include circuitry to convert an electrical signal to an optical signal and to transmit the optical signal. The circuitry may include a laser, a laser driver, signal conditioning circuitry, such as clock and data recover (CDR) circuitry, for example, amplifiers, one or more microcontrollers, a photodetector, and other circuitry. The printed circuit board 306 also may include circuitry to receive an optical signal and to convert the optical signal to an electrical signal. In one embodiment, one end of the heat pipe 116 may be located over the transmitter circuitry 308.

In embodiments of the present invention, the thermal interface material (TIM) 310 and 312 may be thermal gap pads.

The method 200 begins with a block 202, where control passes to a block 204.

In the block 204, the module 110 may generate heat. In one embodiment, the module 110 may generate heat as the components on the printed circuit board 306 operate. For example, when the optical transponder assembly 100 is transmitting, the transmitter circuitry 308 may generate heat in such a way that heat may be focused around the portion of the printed circuit board 306 where the transmitter circuitry 308 is located but not around the portion of the printed circuit board 306 where other components are located.

Figure 4:
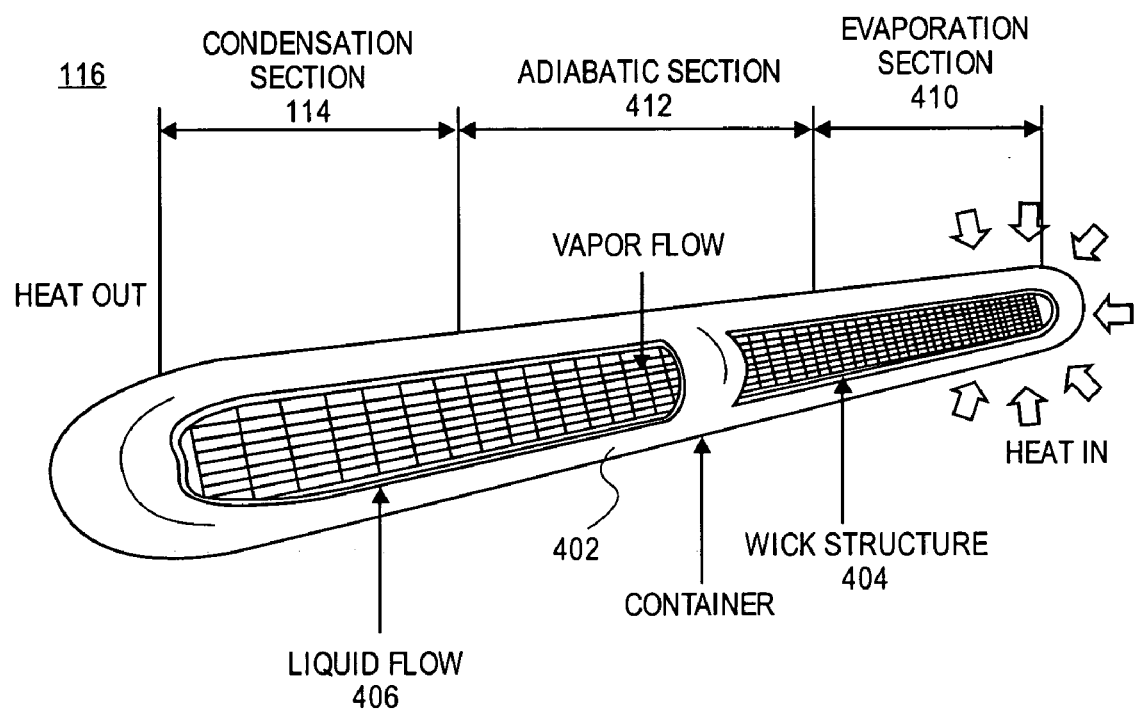
FIG. 4 is a diagram of a heat pipe according to an embodiment of the present invention.

In a block 206, heat may be transferred from the module 110 to the heat pipe 116. In one embodiment, heat may be transferred from the transmitter circuitry 308 to the end of the heat pipe 116 that is located proximate to the transmitter circuitry 308. FIG. 4 is a diagram of the heat pipe 116 according to an embodiment. In the illustrated embodiment, the heat pipe 116 includes a container 402 having a wick structure 404 and a liquid 406. The illustrated heat pipe also includes an evaporation section 410, an adiabatic section 412, and a condensation section 414.

The container 402 may be made from any suitable materials having high thermal conductivity, such as copper, for example. The outside surface of the heat pipe 116 may be in contact to the heat sink 112 by means of mechanical attachment.

The wick structure 404 may be baffles or other suitable structure that allows evaporating liquid to travel from one end of the heat pipe 116 to the other end of the heat pipe 116.

The liquid 406 may be alcohol, ammonia, acetone, methanol, ethanol, or any suitable liquid that evaporates when it is heated.

In one embodiment, heat may be transferred from the module 110 to the evaporation section 410 of the heat pipe 116. The temperature of the liquid 406 in the evaporation section 410 may become so high that the liquid 406 may substantially evaporate.

In a block 208, heat may be moved from one end of the heat pipe 116 to another end of the heat pipe 116. In one embodiment, as the evaporating liquid 406 fills the container 402 and spreads towards the colder condensing section 414, the vapor 406 may travel along the wick structure 404 to the adiabatic section 412. The vapor 406 may begin to cool down in the adiabatic section 412 and there may be a mixture of water and liquid in the adiabatic section 412. The water-vapor mixture 406 may travel along the wick structure 404 to the condensation section 414. The temperature in the condensation section 414 may be low enough to cause the water-vapor mixture 406 to substantially condense back into the liquid 406.

In a block 210, heat may be transferred from the second end of the heat pipe 116 back to the module 110. In one embodiment, the condensation process may cause heat the liquid acquired during evaporation to be released.

In a block 212, heat may be transferred from the module 110 to the heat pipe 118 in the heat sink 112.

In a block 214, heat may be transferred from the heat pipe 118 to the heat sink 112. In one embodiment, the heat pipe 118 has similar structure and operates similarly to the heat pipe 116.

In a block 216, the heat sink 112 dissipates heat received from the module 110.

The thermodynamic cycle in blocks 204-214 may repeat and continue until, ideally, there would be no temperature difference between the hot and cold ends of the heat pipes 116/118 regardless of the rate of heat transfer. However, there may be physical limits to the heat transfer rate, due to varying temperature differences between the hot end and the cold end of the heat pipes 116/118. Also as well as rate of heat flow that can be transferred for a given temperature difference between the hot and cold ends. The heat must conduct through several interfaces and conditions. This includes heat transferred through varying thickness of the pipe walls, the thermal path of the liquid before it boils and after it condenses, and pressure differences between the hot and cold ends caused by aerodynamic friction In a block 218, the method 200 finishes.

The operations of the method 200 have been described as multiple discrete blocks performed in turn in a manner that may be most helpful in understanding embodiments of the invention. However, the order in which they are described should not be construed to imply that these operations are necessarily order dependent or that the operations be performed in the order in which the blocks are presented. Of course, the method 200 is an example process and other processes may be used to implement embodiments of the present invention. A machine-accessible medium with machine-readable data thereon may be used to cause a machine, such as, for example, a processor (not shown) to perform the method 200.

Figure 5:
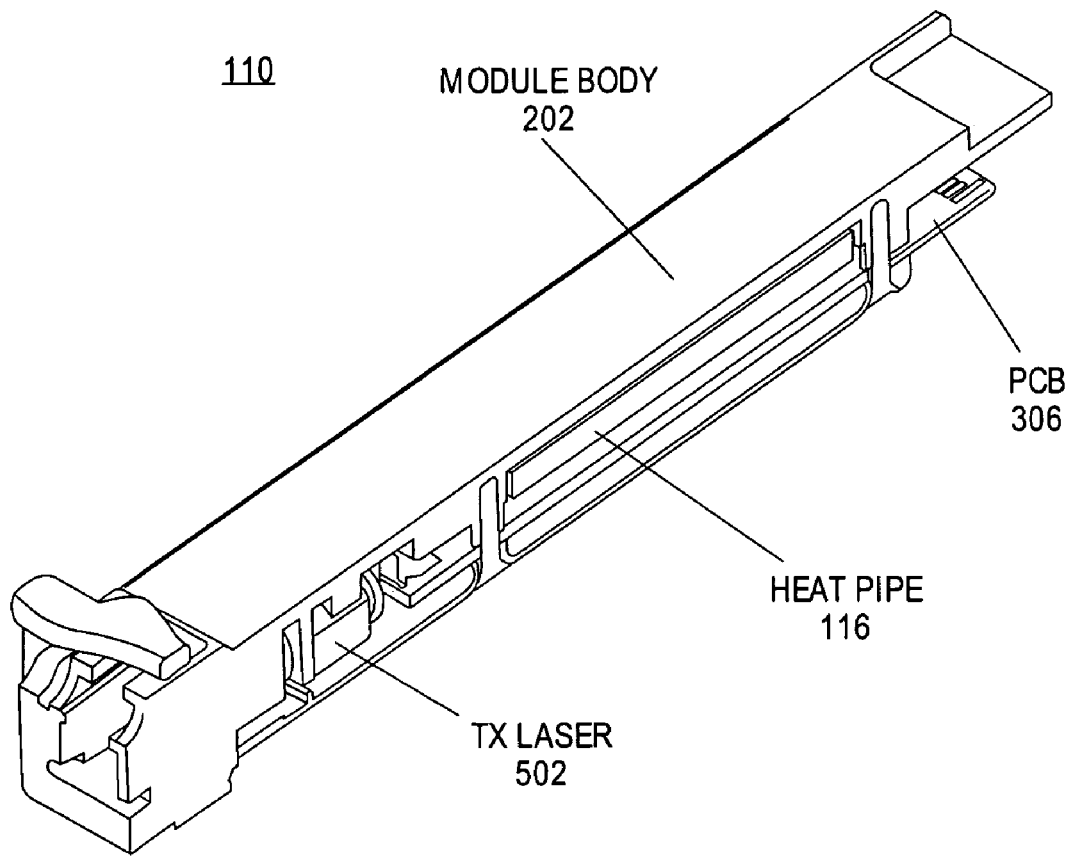
FIG. 5 is a cross-section view of an optical transponder module according to an embodiment of the present invention.

FIG. 5 is a cross-section view of the optical transponder module 110 according to an embodiment of the present invention. In the illustrated embodiment, the heat pipe 116 is embedded in the module body 202 above the printed circuit board 306, with one end of the heat pipe 116 near a laser 502.

Figure 6:
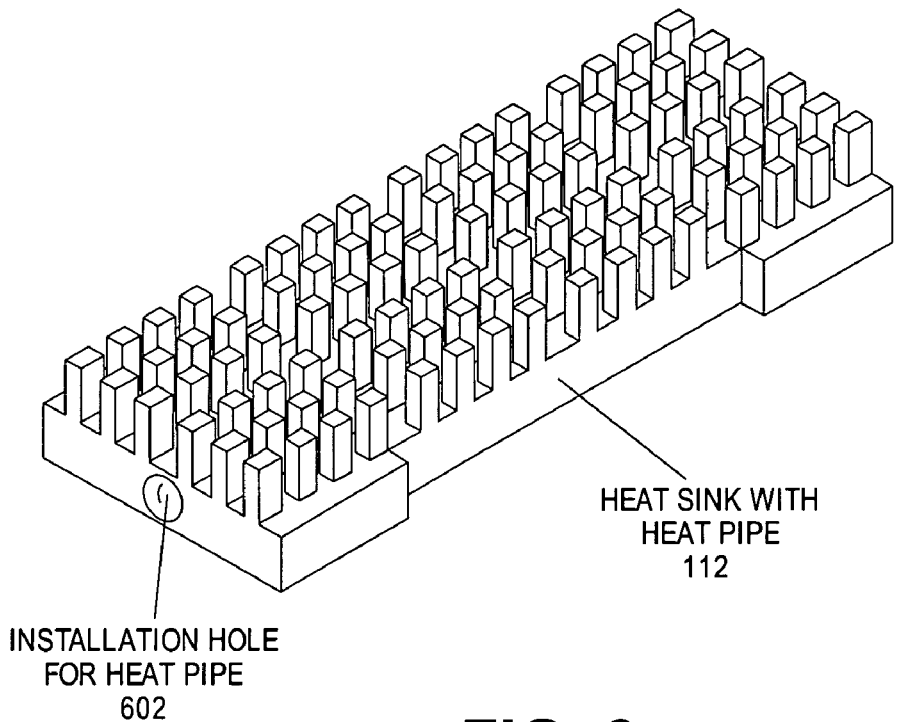
FIG. 6 is a perspective view of a heat sink according to an embodiment of the present invention.

FIG. 6 is an isometric diagram of the heat sink 112 according to an embodiment of the present invention. In the illustrated embodiment, the heat pipe 118 is embedded in the heat sink 112. An installation hole 602 may be used to dispose the heat pipe 118 in the heat sink 112.

Figure 7:
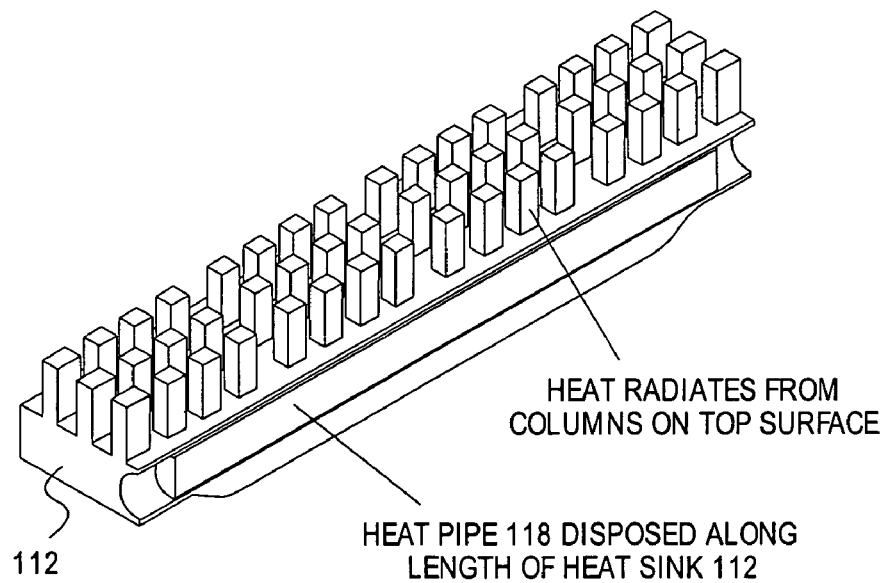
FIG. 7 is a cross-section view of a heat sink a according to an embodiment of the present invention.

FIG. 7 is a cross-section view of the heat sink 112 according to an embodiment of the present invention. In the illustrated embodiment, the heat pipe 118 is embedded in the heat sink 112. An installation hole 602 may be used to dispose the heat pipe 118 in the heat sink 112. In operation, the localized heat from the module 110 spreads substantially over the length of the heat pipe 118 and substantially throughout the large surface area of the external heat sink 112.

FIG. 8 is a perspective view of an optical transponder assembly 800 according to an alternative embodiment of the present invention. The illustrated example assembly 800 is similar to the optical transponder assembly 100 in that it the optical transponder module 110 coupled to the host board 102 and the heat sink 112 removably coupled to the optical transponder module 110. In the illustrated embodiment, the optical transponder assembly 800 also includes a heat pipe 818 disposed in the heat sink 112. In the illustrated embodiment, the heat pipe 818 is a version of the heat pipe 118 that is extended beyond the length of the heat sink 112 to expose one end of the heat pipe 818. A radiator 802 is attached to the exposed end of the heat pipe 818 in the illustrated embodiment.

For some embodiments, the radiator 802 may be positioned on the host board 102 such that air flow would pass through the radiator 802 to remove heat from the optical transponder assembly 800.

FIG. 9 is a perspective view of the top of the radiator 802 in more detail according to an embodiment of the present invention. In the illustrated embodiment, the radiator 802 includes fins 902. For some embodiments, the fins 902 would be placed in-line with positive air flow to assist in cooling of the optical transponder assembly 800. FIG. 10 is a perspective view of the bottom of the radiator 802 according to an embodiment of the present invention.

Embodiments of the present invention may be implemented using hardware, software, or a combination thereof. In implementations using software, the software may be stored on a machine-accessible medium.

A machine-accessible medium includes any mechanism that may be adapted to store and/or transmit information in a form accessible by a machine (e.g., a computer, network device, personal digital assistant, manufacturing tool, any device with a set of one or more processors, etc.). For example, a machine-accessible medium includes recordable and non-recordable media (e.g., read only memory (ROM), random access memory (RAM), magnetic disk storage media, optical storage media, flash memory devices, etc.), such as electrical, optical, acoustic, or other form of propagated signals (e.g., carrier waves, infrared signals, digital signals, etc.).

In the above description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
    an optical transponder module, the optical transponder module to generate heat;
    a cage assembly, the optical transponder module being disposed in the cage assembly;
    a heat sink removably disposed on the cage assembly;
    a seventy-pin connector coupled to the optical transponder module; and
    a heat pipe disposed in the optical transponder module, the heat pipe to transfer heat from a first location in the optical transponder module to a second location in the optical transponder module,
    wherein a first end of the heat pipe is in proximity to transmitter circuitry disposed in the optical transponder module, the first end of the heat pipe to transfer heat from the transmitter circuitry to the second location in the optical transponder module.

2. The apparatus of claim 1, further comprising:
    a heat sink removably attached to the optical transponder module, wherein the heat sink is to transfer heat away from the optical transponder module; and
    a second heat pipe disposed in the heat sink, wherein the second heat pipe is to transfer heat from a third location in the heat sink to a fourth location in the heat sink.

3. The apparatus of claim 2, wherein the cage assembly is a faraday cage.

4. The apparatus of claim 2, wherein an end of the second heat pipe extends beyond the heat sink and wherein a radiator is removably attached to the extended end of the second heat pipe.

5. The apparatus of claim 1, wherein the optical transponder module includes a body and a bottom cover, wherein the first heat pipe is disposed in the optical transponder module body.

6. The apparatus of claim 5, further comprising an interface material disposed between the optical transponder module and the circuitry.

7. The apparatus of claim 5, further comprising thermal interface material disposed between the transmitter circuitry and the optical transponder module body.

8. A system, comprising:
    an optical transponder module;
    a cage assembly, the optical transponder module being disposed in the cage assembly;
    a heat sink removably disposed on the cage assembly;
    a printed circuit board disposed in the optical transponder module, transmitter circuitry being disposed on the printed circuit board;
    a heat pipe disposed in the optical transponder housing, a first end of the heat pipe to transfer heat from the transmitter circuitry disposed on the printed circuit board to a body of the optical transponder module; and
    a seventy-pin connector coupled to the optical transponder module.

9. The system of claim 8, wherein the printed circuit board comprises circuitry to transmit and/or receive an optical signal.

10. The system of claim 8, further comprising:
    at least one heat sink removably connected to the optical transponder module; and
    at least a second heat pipe disposed in the heat sink, the second heat pipe to transfer heat from the optical transponder module to the heat sink, the heat sink to dissipate heat.

* * * * *